United States Patent [19]
Bruges

[11] 4,126,269
[45] Nov. 21, 1978

[54] VENTILATED ENCLOSURE

[75] Inventor: Jean-Claude Bruges, Yerres, France

[73] Assignee: Compagnie Internationale pour l'Informatique Cii-Honeywell Bull, Paris, France

[21] Appl. No.: 775,789

[22] Filed: Mar. 9, 1977

[30] Foreign Application Priority Data

Mar. 10, 1976 [FR] France ............... 76 06867

[51] Int. Cl.² .............................................. F24F 7/00
[52] U.S. Cl. .................................... 236/49; 361/384; 116/114 Y; 73/362 CP; 236/DIG. 9; 236/DIG. 19
[58] Field of Search .......... 236/49, DIG. 19, DIG. 9; 361/384; 116/114 Y; 73/1 F, 362 CP

[56] References Cited
U.S. PATENT DOCUMENTS

| | | | |
|---|---|---|---|
| 1,358,193 | 11/1920 | Fulton | 236/49 |
| 1,833,950 | 12/1931 | Modine | 236/49 |
| 2,128,096 | 8/1938 | Loepsinger | 236/49 X |
| 2,167,472 | 7/1939 | Bedford | 236/49 |
| 3,015,217 | 1/1962 | Beemer | 236/494 U X |
| 3,054,044 | 9/1962 | Shevel | 73/362 CP |
| 3,329,341 | 7/1967 | Jones | 236/49 |
| 3,413,540 | 11/1968 | Vansant | 73/362 CP |
| 3,749,981 | 7/1973 | Koltuniak | 361/384 |

Primary Examiner—Clarence R. Gordon.
Attorney, Agent, or Firm—Cameron, Kerkam, Sutton, Stowell & Stowell

[57] ABSTRACT

A ventilated enclosure is formed by an air duct, one end of which is closed off by a partition pierced with ventilation apertures and the other end of which is closed off by a wall to which is attached at least two fans and which is provided with openings through which air drawn into the interior of the enclosure from its exterior is passed. Each fan is provided with a detection device for detecting inadequate ventilation. The detection device is positioned in the area which is swept by the stream of air which is produced by the associate fan when in operation and generates a signal when the output of air from this fan falls below a predetermined limiting value. Each detection device consists of a thermal detection element designed to emit a signal when its temperature becomes equal to a predetermined temperature threshold and an air non-return casing. The air non-return casing contains the thermal detection element and is arranged to have passed through it only a fraction of the air output from the associated fan. This fraction of air output is such that, when the output from the fan is equal to the said predetermined limiting value, the temperature which prevails within the casing is equal to the said predetermined threshold.

14 Claims, 7 Drawing Figures

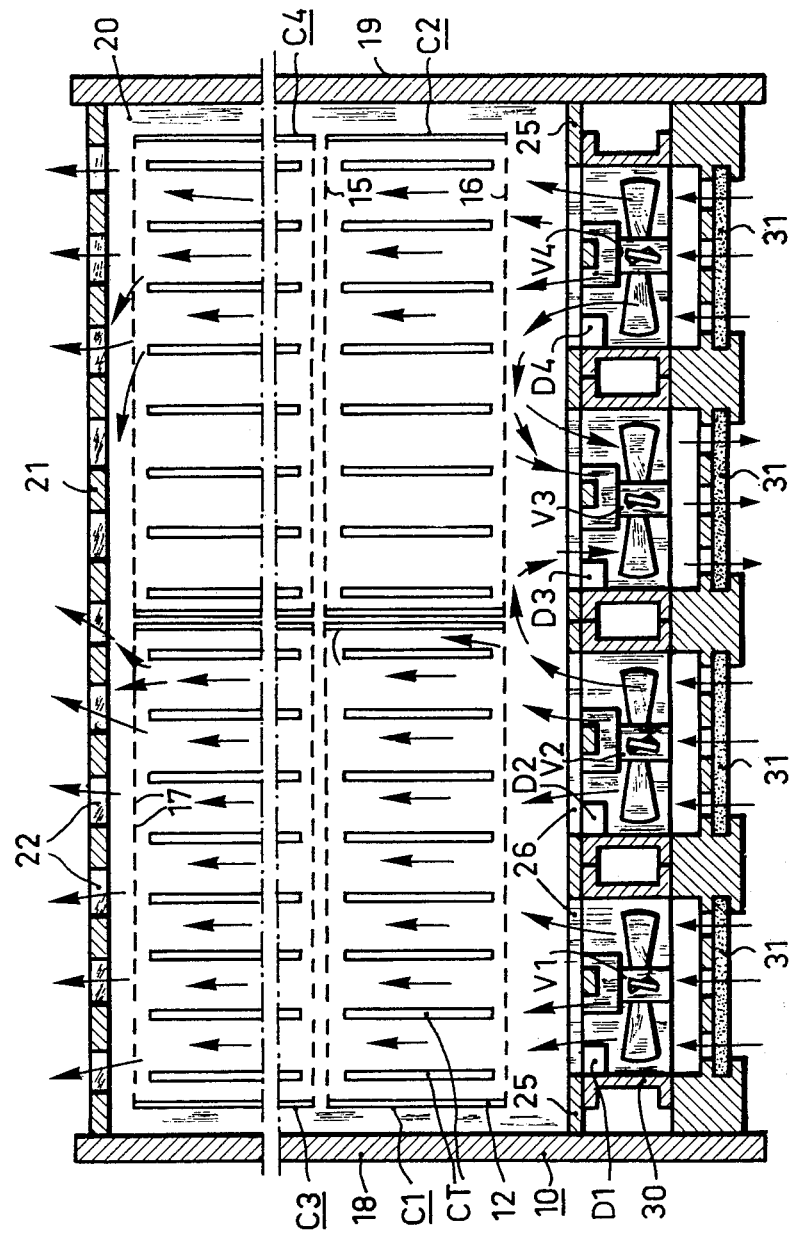

VENTILATED ENCLOSURE

BACKGROUND OF THE INVENTION

1. Field of the Invention

The present invention relates to ventilated enclosures in which the temperature must be maintained at a substantially constant level or must not rise above (or fall below) a predetermined limiting level.

2. Description of the Prior Art

Such enclosures are generally formed either by rooms into which hot or cold air is pumped by means of fans, or by cabinets within which a flow of hot or cold air, which is produced by fans, possibly associated with heating or refrigerating means, is used to heat or cool articles in the cabinets. More particularly, these cabinets may be of the kind which are used to hold the electrical or electronic circuits of a control or regulating installation or some other kind of installation, which circuits dissipate heat in the course of operation and consequently need to be cooled if they are to be capable of operating properly.

In order to allow effective passage for the flow of air produced by the fans, each enclosure thus takes broadly the form of an air duct, one of whose ends is closed off by a partition or a plate pierced with ventilation apertures, and whose other end is closed off by a rigid wall provided with openings which are designed to provide access for the flow of air caused by fans fixed to this wall. An enclosure of this kind may be formed, for example, by a box for connecting printed-circuit boards of the type which is described and illustrated in U.S. Pat. Nos. 3,699,396 and 3,868,158. Advantageously, such an enclosure is provided with at least two fans, which enables ventilation to be continued even when one of the fans breaks down. In addition, the use of a plurality of fans ensures more satisfactory distribution of the circulated air within the enclosure.

In the majority of cases, for example in cases where the enclosure is formed by a cabinet containing electronic circuits, or again in cases where the enclosure is intended to provide a controlled environment for items which do not easily withstand heat or cold, it is also essential for the temperature within the enclosure to remain below or above a predetermined limiting value. This requirement may be met by placing within the enclosure a thermal detection device which generates a signal as soon as its temperature becomes higher than or lower than the predetermined limiting threshold. However, in cases where the enclosure contains electronic components, a detector of this kind often proves unsatisfactory because it fails to detect abnormal rises in temperature in time to protect the components against catostrophic changes in temperature. In effect, the detector, positioned as it is in the stream of air at the outlet, fails to produce a signal until after the air has heated up abnormally from contact with the components which has ceased to be cooled as a result of the stoppage of the fan. The result is that the components may have already been damaged at the time when the signal produced by the detector appears.

To overcome this drawback, it has been proposed to mount on each fan a device for detecting inadequate ventilation which is designed to produce a signal when the speed of rotation of the associated fan falls below a predetermined limiting value. Such a detection device may be formed for example by a dynamo which is coupled to the drive-shaft of the fan and which produces an electromotive force whose magnitude is proportional to the speed of rotation of the shaft and can be measured by apparatus of a known kind. However, this solution has the disadvantage that it involves a relatively high initial cost and that it fails to reveal the reductions in air flow which may occur, even if the fans are turning at their normal speed, when the air-inlet openings opposite which the fans are mounted become partially or totally obstructed as a result of an accumulation of dust or of accidental blockage by an object such as a sheet of paper, for example. In this case, the fans circulate hot air around inside the enclosure.

SUMMARY OF THE INVENTION

The present invention substantially reduces or overcomes these drawbacks and provides a ventilated enclosure which is traversed by a flow of air produced by at least two fans, and which is fitted with relatively inexpensive detection means which are capable of detecting the inadequate output or flow of air from or in the enclosure which results from a ventillating fan for the enclosure stopping or from the air inlets of the enclosure becoming partially or totally blocked.

One aspect of the invention relates to a ventilated enclosure which is formed by a duct, one of whose ends is closed off by a partition pierced with ventilation apertures and whose other end is closed off by a wall provided with openings which are designed to provide passage for the air which is drawn into the interior of the enclosure from its exterior by at least two fans which are attached to this wall, the said enclosure being characterized in that each fan is provided with a detection device for detecting inadequate ventilation, the detection device is advantageously positioned in the area which is swept by the stream of air which is produced by the associated fan when in operation, and generates a signal when the output of air from this fan falls below a predetermined limiting value. Each detection device includes a thermal detection element which is designed to emit a signal when its temperature becomes equal to a predetermined temperature threshold and an air non-return casing. The air non-return casing contains the thermal detection element and is arranged to have passed through it only a fraction of the air output from the associated fan. This fraction of air output is such that, when the output from the fan is equal to the said predetermined limiting value, the temperature which prevails within the casing is equal to the said predetermined threshold.

BRIEF DESCRIPTION OF THE DRAWINGS

Other features and advantages of the invention will become apparent from the following description, which is given by way of non-limiting example and refers to the accompanying drawings, which show:

FIG. 2 is a partial cross-sectional view of the assembly shown in FIG. 1 taken on the chain line looking in the direction of arrows 2—2, with the lower drawer covers removed for clarity to show the filters, fan elements and associated passages in full;

DESCRIPTION OF THE PREFERRED EMBODIMENTS

Figure 1:
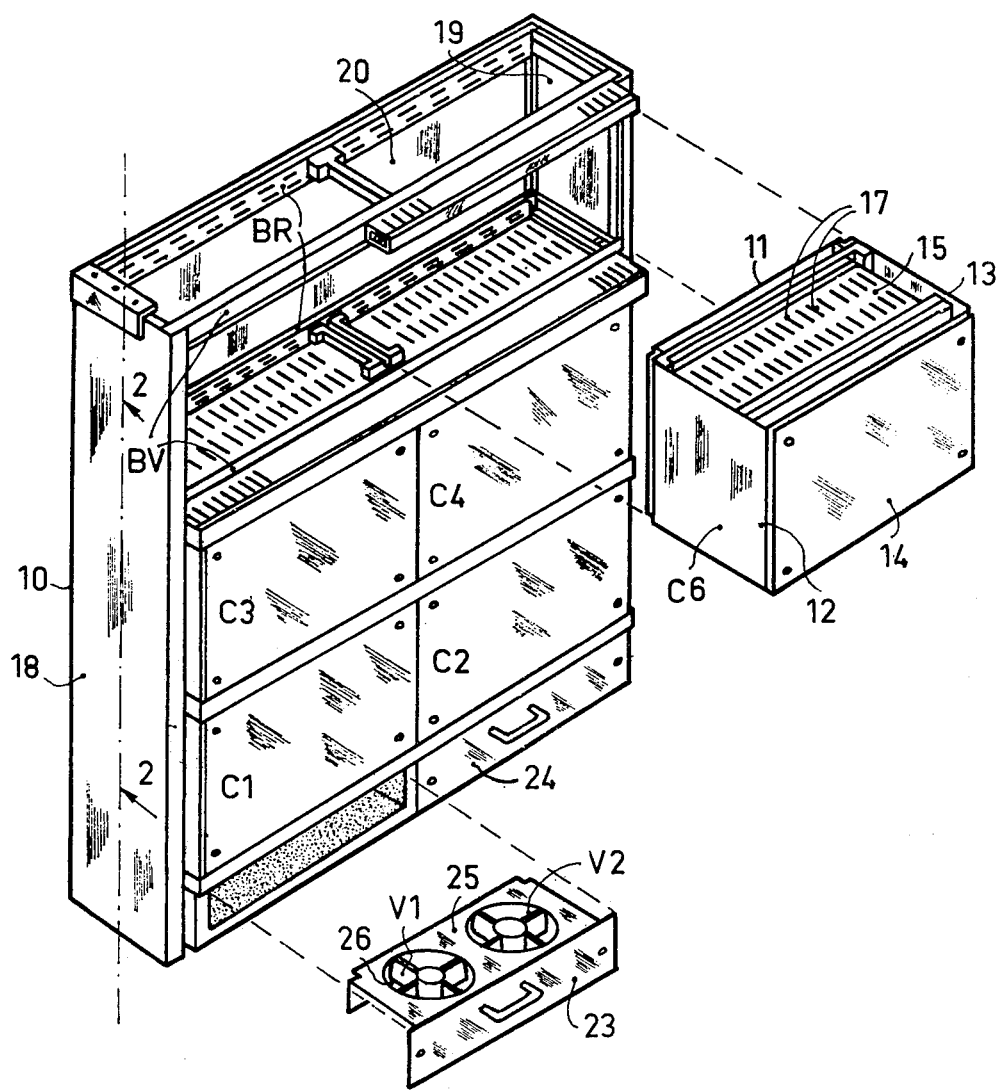
FIG. 1 is a perspective view showing a group of ventilated enclosures formed by assembling boxes for connecting printed-circuit boards in a support rack.

The assembly which is shown in FIG. 1 includes a support rack 10 in which is housed a plurality of connecting boxes or housings C1, C2, C3, etc. Each of these boxes conveniently supports electrical circuits which are grouped together in the form of printed-circuit boards. For details of the construction of these boxes, reference may be made to U.S. Pat. No. 3,699,395, the subject matter of which is incorporated by reference herein.

Without repeating the entire explanation given in this patent, it will suffice for purposes of explanation to state that each of the boxes is broadly in the shape of a parellelepiped, formed, as shown in FIG. 1, by a back plate 11, two side plates 12 and 13 and a front plate 14, and of which the upper and lower faces are formed, as can be seen in FIGS. 1 and 2, by two gratings 15 and 16 which are suitably pierced so as to provide ventilation apertures 17. The printed circuit boards contained in these boxes are designated in FIG. 2 by reference numeral CT. It can thus be seen that, in each box, the cards CT are arranged parallel to one another and to the side plates 12 and 13 of the box. In the embodiment shown in FIGS. 1 and 2, the connecting boxes C1, C2, C3, etc., are of identical dimensions and are so arranged in the support rack 10 as to form superimposed rows, the boxes being placed beside one another in each of the rows to form adjacent vertical columns.

Referring to FIGS. 1 and 2, it can be seen that the support rack 10 is formed by two side plates 18 and 19 which are connected together by a set of horizontally disposed front bars BV and a set of horizontally disposed rear bars BR and by a back plate 20 which is attached in a known manner to the rear bars BR. The upper part of the support rack, is completed by a partition 21 which is provided with ventilation apertures 22; the partition 21 having been omitted from FIG. 1 for the sake of clarity.

As shown in FIGS. 1 and 2, the circuits on the boards CT which are contained within the connecting boxes which have been placed in the support rack 10 are adapted to be cooled by small fans V1, V2, V3, etc., which are housed in drawers such as 23 and 24 arranged in the lower part of the support rack and which when energized cause air to circulate through the boxes mounted in the support rack. The air passes over the board CT as shown in FIG. 2 and through the ventilation apertures 17 and 22 mentioned above.

FIGS. 1 and 2 show that, in the embodiment being described, each drawer disposed below the columnar arranged boxes is formed by an upper support plate 25 to which the fans are mounted. The plate 25 is provided with openings 26 arranged to allow free passage to the air drawn in by the two fans attached to the support plate. The connecting boxes forming a column are so positioned that each box is traversed by the stream of air produced by both the fans mounted in an associated drawer. This being the case, if only a single connecting box, such as box C1, is positioned just above a drawer such as 23, this box acts as a ventilated enclosure in which the stream of air produced by the fans V1 and V2 housed in the drawer is channelled by the air duct formed by the plates 11, 12, 13 and 14 of the box. Similarly, in cases where a plurality of boxes are superimposed above the same set of fans in columnar fashion (such as for example, by boxes C1 and C3 which in FIG. 1 are superimposed above fans V1 and V2), a single air duct is formed by the assembly. The superimposing of such boxes of identical dimensions forms a ventilated enclosure in which the stream of air produced by fans V1 and V2 is channeled by the single air duct created by lining up the air ducts of individual boxes end-to end.

In the embodiment shown in FIG. 1, it can thus be seen that the boxes C1 and C3 which are superimposed just above the fans V1 and V2 housed in drawer 23 form a first ventilated enclosure traversed by the stream of air from these fans, while the boxes C2 and C4 which are superimposed just above the fans housed in drawer 24 form a second ventilated enclosure traversed by the stream of air from these latter fans.

The term ventilated enclosure is defined for purposes of this specification is including any air duct which is designed to have indrawn air pass through it, preferably from the exterior to the interior of the duct, by fans which are attached or supported to a wall arranged at one end of the duct. Thus, such a ventilation enclosure could equally well be formed, for example, by a cabinet containing electrical or electronic circuits which heat up in operation and therefore need to be cooled in order to operate correctly, or again by a room in which air conditioning is provided by blowing in hot or cold air.

The printed circuit boards CT, instead of being mounted in connecting boxes as in the embodiment shown in FIGS. 1 and 2, could be arranged for support within a single enclosure or air duct which could be produced by withdrawing the connecting boxes from the support rack 10 and attaching a plate similar to the back plate 20 to the front bars BV of the support rack in such a way as to form a vertical air duct through which the flow produced by fans V1, V2, V3 and V4 would pass, this air duct being closed off at its upper end by the partition 21 which contains the apertures 22 and at its lower end by the support plates 25 to which the fans are attached.

FIG. 2 also shows that each fan is mounted within a circular shroud 30 which in turn is mounted on one of the support plates 25. Across this shroud is fitted a filter 31 which is intended to trap the dust which is entrained in the air drawn in by the fan. Also, in cases where hot air has to be pumped into the enclosure, the fans are normally associated with one or more heating members, which heating members may, for example, each be formed by an electrical resistor.

In accordance with the present invention, each fan is equipped with a device for detecting a state of inadequate ventilation. As shown in FIG. 2, each detection device is designated by one of the references D1, D2, D3, etc., with device D1 being associated with fan V1, device D2 with fan V2 and so on. It can be seen in FIG. 2 that each of the detection devices is fixed inside a shroud 30 of the fan with which it is associated, that is to say in the area which is swept away by the stream of air which the fan produces when it is operating. Each detection device is intended to generate a signal when the output of air from the fan with which it is associated falls below a predetermined limiting value, either as a result of an accidental blockage of the opening or openings across which the filter of the fan is positioned, or as a result of the fan stopping or merely of its speed of rotation dropping considerably. In the embodiment illustrated and described, in which the air output of each fan is of the order of 50 liters per second when operating normally, this limiting value is selected to be 30 liters a second, which represents 60% of normal output.

Figure 3:
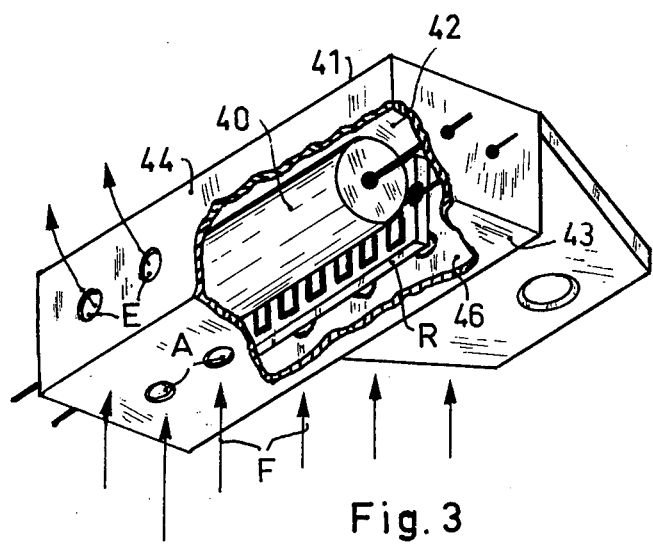
FIG. 3 is a partially cut-away perspective view of a device for detecting inadequate ventilation such as is fitted to each of the fans in the assembly shown in FIG. 1.

There will now be described in greater detail, with reference to FIG. 3, the constitution of a device for detecting inadequate ventilation which is produced in accordance with the invention. This detection device comprises, as shown in FIG. 3, a thermal detection element 40 of a known kind, which is shown in schematic cross-section in FIG. 4, and an air non-return casing 41 in which the thermal detection element is housed.

Figure 4:
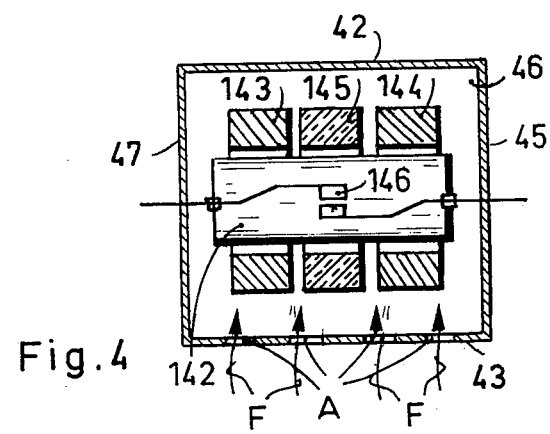
FIG. 4 is a partial cross-sectional view showing the composition of the thermal detection element of the detection device shown in FIG. 3.

FIG. 4 shows that the thermal detection element 40 is formed by a capsule 142 of cylindrical shape around which are arranged, concentric with the capsule, two permanently magnetized rings 143 and 144 and a ferrite ring 145. Ferrite ring 145 is positioned between rings 143 and 144. An electrical contact or switch 146 is housed in the capsule 142 at right angles to the ferrite ring 145 and along the longitudinal axis of rings 143, 144 and 145. Switch 146 is constructed such that the contact arms have mechanical resilience biasing it towards the open position; however, the switch contacts are normally held closed by the magnetic forces generated by rings 143 and 144. The lines of magnetic force of rings 143 and 144 are concentrated by ferrite ring 145 into a restricted region of space around contact 146.

If, for any reason, the temperature of the ferrite ring 145 rises and reaches a value corresponding to the Curie point of the ferrite, the ring 145 loses its magnetic properties and thus, brings about a change in the path of the lines of force and consequently causes the switch contacts to open as a result of the reduced concentration of these lines in the region where the contacts are situated. The Curie point depends on the composition of the ferrite from which ring 145 is formed. In the example described, the composition has been so selected that the Curie point of the ring 145 is 70° C.

It should be readily apparent that the type of thermal detection element which has just been described is in no way limiting, and that it could be replaced, to suit particular cases and applications, by any other type of element of preselected characteristics which is capable of generating a signal when its temperature reaches a predetermined limiting threshold. Thus, for example, the detection element could be formed by an element of a kind similar to that which has just been described, but in which the contact is normally open when the temperature of the ferrite ring is lower than its Curie point and which closes when the temperature of the ring exceeds the Curie point. Similarly, rings 143, 144 and 145 could be replaced by three parallelepipeds arranged side-by-side, that is to say, two permanently magnetized parallelepipeds enclosing a ferrite parallelepiped.

Figures 5, 6:
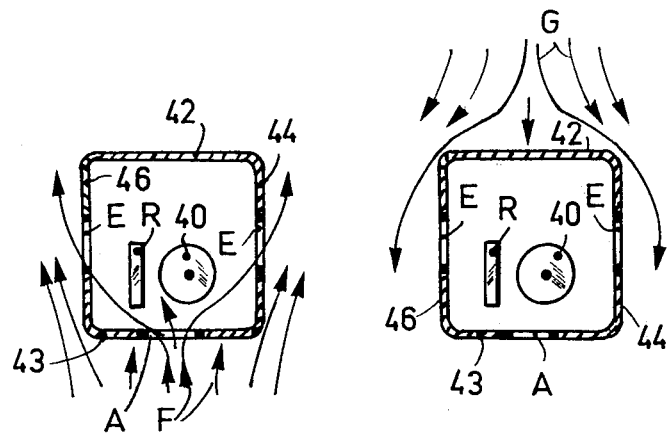
FIGS. 5 and 6 are two views partially in cross section, diagrammatically illustrating the function of the air non-return casing when ventilation is normal and when the ventilation stops.

The air non-return casing 41 which encloses the thermal detection element 40 just described is, so produced that only a part of the stream of air produced by the associated fan passes through it. As shown in FIGS. 3, 4 and 5, this air flows in the direction which is indicated by arrows F. Thus, in the embodiment being described, the casing 41 is in the shape of a right-angled parallelepiped having two base-walls 42 and 43 and four side walls 44, 45, 46 and 47. The thermal detection element 40 extends parallel to base walls 42, 43 and to two of the side walls 44 and 46. Casing 41 is mounted in the shroud 30 of the associated fan in such a way that its base wall 43, which will be referred to in the remainder of the text as its front wall, is orientated in a plane normal to the stream of air produced by the fan. In other words, this front wall 43 is perpendicular to the arrows F which indicate the direction of movement of air caused by the fan and the side walls 44, 45, 46 and 47 of the casing 41 are orientated parallel to the flow of air.

FIGS. 3 and 4 show that the front wall 43 and the side walls 44 and 46 of the casing are provided with orifices. The orifices formed in the front wall 43 are identified by reference character A and the orifices formed in the side-walls 44 and 46 are identified by reference character E. Inasmuch as orifices A face into the stream of air from the associated fan and that the orifices E are orientated tangentially to this flow, a part of the air blown by the fan is able to penetrate into casing 41 through orifices A, as shown by FIG. 5, and to leave it through orifices E. Depending upon whether the temperature of the air drawn in by the associated fan is higher or lower than that which would prevail within the enclosure if there were no ventilation, the air which passes through casing 41 either heats or cools the thermal detection element 40 situated in the casing.

In cases where the enclosure is intended to be cooled, the number and size of the orifices A and E are determined by experiment, in relation to the temperature of the air driven into the enclosure, in such a way that the temperature $\theta d$ to which the thermal detection element rises when the flow of air from the associated fan is equal to 60% of its normal output, is equal to or, failing this, is slightly higher than, the Curie point $\theta c$ of the ferrite forming the ring 145 in the detection element. However, with the device for detecting inadequate ventilation which has just been described, this requirement can only be met if the Curie point $\theta c$ of the ferrite is lower than the limiting temperature $\theta I$ which should not be exceeded in the enclosure. If, on the other hand, the Curie point $\theta c$ is higher than the limiting value $\theta I$, then it is necessary to add to the thermal detection element contained in the casing an additional heating element which enables the detection element to be raised to the Curie point temperature $\theta c$ when the output of air from the associated fan falls to 60% of its normal value. Under these conditions, when the output from the fan is normal, the temperature of the detection element is lower than, but nevertheless close to, the Curie point temperature $\theta c$.

In the embodiment shown in FIG. 3, the additional heating element is formed by an electrical resistor R which is produced by depositing a thick film of an electrically resistive material on a flat support. Resistor R is arranged close to the detection element 40. The value of this resistor is selected, as a function of the intensity of the current which it carries, in such a way that the power which the resistor dissipates is sufficient to raise the detection element to its Curie point in a time of not more than two minutes from the time when the output of the associated fan falls to 60% of its normal value.

In the embodiment described, the detection element is approximately 15 mm long and approximately 6.5 mm in diameter. The resistor R is in the shape of a rectangle the length of which is substantially equal to that of the detection element and the width of which is substantially equal to the diameter of the element. The resistor dissipates a power of the order of 1.5 watts in the form of heat energy and it is arranged, as shown in FIG. 3, parallel to the detection element 40. The gap between the resistor and the element 40 is of the order of a fraction of a millimeter. The length of the casing 41 in which the resistor R and element 40 are enclosed is of the order of 3 cm, while its width and depth are substantially equal to 1 cm. The walls 43, 44 and 46 of the housing are each provided, in the embodiment described, with four orifices each of which is of the order of 1.5 mm in diameter.

Under these conditions, if the air output from the associated fan is normal, i.e. in the example described, is of the order of 50 liters of air per second, and if the temperature of this air is of the order of 20° C., the detection element 40 is raised to a temperature close to 60° C., that is to say, a temperature lower than the Curie point of the ferrite. Because of this, contact 146 of the element is closed. If the output subsequently falls to 60% of its normal value, that is to say to a level of 30 liters per second, the detection element 40 is raised, within the space of approximately 30 seconds, to a temperature slightly higher than 70° C. Ring 145, whose Curie point is 70° C., then loses its magnetic properties and contact 146 therefore opens and a signal is generated, in a manner which will be described below, as a consequence of the break in the electrical circuit in which contact 146 is connected.

In cases where the enclosure is intended to be heated, on the other hand, the number and size of the orifices A and E mentioned above are so selected, in relation to the temperature of the air driven into the enclosure, that the temperature $\theta d$ to which the detection element is brought when the flow of air produced by the associated fan is equal to 60% of its normal value is slightly lower than the Curie point of the ferrite. The result is that, when the output of the fan is normal, the detection element is raised to a temperature higher than the Curie point and contacts of switch 146 thus remain open. If the output then falls to 60% of its normal value, the detection element 40 is brought to a temperature lower than that of the Curie point. Because of this, contacts of switch 146 close, thus causing a signal to appear in the electrical circuit in which the switch is incorporated.

In FIG. 2, the arrows indicate the the path which is followed by the air drawn into the support rack 10 described in detail above, in that situation where fans V1, V2, and V4 are rotating normally and fan V3 is stopped. Since the air is under pressure in the lower part of the support rack contained between the fans and the connection boxes, a return flow of air takes place through the fan V3 which is not operating. Also, because this fan is stopped, the circuits on the boards located above it receive scarcely any cool air and are thus no longer cooled. It can be seen from FIG. 2 that the air which emerges from the support rack by passing through the fan V3 which is stopped, travels in the opposite direction from that in which it would travel if the fan were operating normally. The detection device D3 which is associated with fan V3 is in the path of this return flow of air but, since top wall 42 of the casing of the device D3 contains no orifices, this flow of air, which is identified in FIG. 6 by arrows G, cannot reach the inside of the casing. The thermal detection element 40 housed in the casing consequently is not cooled by this air flow and it is therefore heated by resistor R and raised, soon after fan V3 stops, to a temperature higher than the Curie point of its ring 145, thus causing its contact 146 to open.

Figure 7:
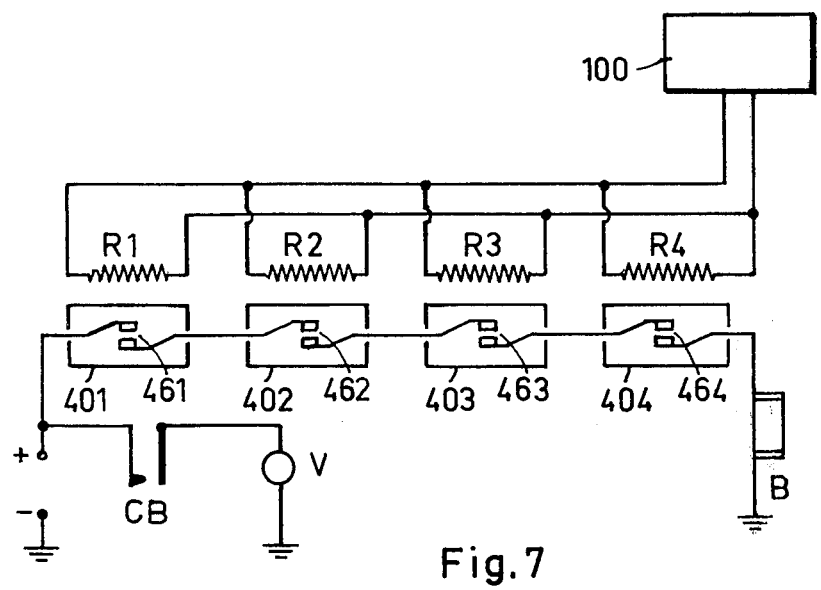
FIG. 7 is a circuit diagram showing the manner of connection of the detection devices fitted to the fans in the assembly shown in FIG. 1.

FIG. 7 illustrates the manner in which the several detection devices D1, D2, D3 and D4 associated with fans V1, V2, V3 and V4 are connected in the embodiment being described. In the figure, the thermal detection elements which form part of devices D1, D2, D3 and D4 respectively are referenced 401, 402, 403, 404 and the switch contacts contained in these elements are referenced 461, 462, 463 and 464 respectively. Similarly, the resistors associated with detection elements 401, 402, 403 and 404 are referenced R1, R2, R3 and R4 respectively. These resistors are connected in parallel across the terminals of a current source 100 which is formed, in the embodiment being described, by a source of alternating current. Contacts 461, 462, 463 and 464 on the other hand are connected in series, as shown in FIG. 7, between the positive terminal (+) of a source of direct current and an alarm device which is formed, in the embodiment being described, by a relay coil B. The contact CB which is controlled by coil B is connected between the positive terminal (+) and an indicator light V. The resistors R1 to R4 being supplied in this fashion, it can be seen that, as long as the air outputs of fans V1 to V4 remain at their normal value, contacts 461 to 464 will remain closed. Under these conditions, a direct current flows from the positive terminal (+) through the closed contacts 461 to 464 and holds coil B energized. Contact CB is arranged to remain open as long as coil B is energized and thus prevents indicator V from being lit. Conversely, as soon as any one of the above air outputs drops to the predetermined limiting value (i.e. 60% of its normal value), the contact of the corresponding detecting element opens and thus de-energizes coil B. Upon B being de-energized, contacts CB close and as a result indicator V lights and indicates that the output of one of the fans V1 to V4 has fallen to a level which is inadequate for proper cooling of the circuits fitted to the boards CT.

The casing in which the thermal detection element is enclosed may be of a shape other than that described above, provided that when it is mounted on the shroud of a fan, the casing has a front wall which faces into the stream of air output by the fan, and has at least one side wall which is orientated tangentially to this stream. Thus, the casing could, for example, take the form of a closed cylindrical box, this box being mounted in such a way that its axis is orientated parallel to the stream of air produced by the associated fan, the front wall and the side wall of the box being provided with orifices which allow only this flow of air to pass through it.

In cases where the Curie point of the ferrite forming the ring in the thermal detection element differs considerably from that which normally prevails in the enclosure, the casing in which the detecting element is placed is made from a thermally insulating material. Thus, in the embodiment described, the casing is made from a plastic material which is preferably formed by a polycarbonate.

Although the description and the accompanying drawings relate to a preferred embodiment of the invention, it is understood that various modifications, additions or substitutions which do not exceed the scope of the said invention could be made, to suit individual application and cases, without the principle of the invention being in any way affected thereby.

I claim:

1. A ventilated enclosure formed by an air duct, one end of which is closed off by a partition having ventilation apertures and the other end of which is closed off by a wall having openings adapted to provide for the passage of air, at least two fans supported to said wall and adapted to be energized to cause air to be drawn into the interior of the enclosure from its exterior, each said fan including a detection device for detecting inadequate ventilation within the enclosure, each said detecting device being positioned in the area which is swept by the stream of air produced by the associated fan when energized, each said detecting device including means for generating a signal when the output of air from this fan falls below a predetermined limiting value, said means consisting of a thermal detection element to emit a signal when its temperature becomes equal to a predetermined temperature threshold, and an air non-return casing, said thermal detection element being supported within said casing and said casing being so constructed and arranged so as to have pass through it only a fraction of the air output from the associated fan, said fraction of air being such that, when the output from the fan is equal to the said predetermined limiting value, the temperature which prevails within the casing is equal to the said predetermined threshold.

2. A ventilated enclosure according to claim 1 wherein each said air non-return casing includes a front wall which faces into the stream of air produced by the associated fan, and at least one side wall which is orientated tangentially to this stream, said casing being provided with orifices solely in its front and side walls.

3. A ventilated enclosure according to claim 1 wherein each said detection device also includes a heating element mounted close to the detection element of the device for raising the detection element to the said predetermined temperature threshold when the limiting temperature not be exceeded in the enclosure is lower than the predetermined temperature threshold and when the air output of the associated fan is equal to the predetermined limiting value.

4. A ventilated enclosure according to claim 3 wherein the number and size of the orifices in each casing cause the thermal detection element contained in the casing to be brought to the predetermined temperature threshold when the output of air from the fan which is associated with said casing falls to 60% of its normal value.

5. A ventilated enclosure according to claim 3, wherein the heating element comprises an electrical resistor having a value which is a function of the intensity of the current which it carries, such that the power which is dissipated by the resistor enables the associated thermal detection element to be raised to the predetermined temperature threshold in a time of not more than two minutes from the moment when the air output of the associated fan falls to 60% of its normal value.

6. A ventilated enclosure according to claim 5, wherein the thermal detection element includes permanent magnetic means and a two position electrical switch, said switch having resilient contacts biased toward a first position but being normally held in a second position by the forces exerted by the said magnetic means, said magnetic means being temperature sensitive such that the contacts return to their first position when the temperature of the casing within which the thermal detection element is situated reaches a value corresponding to the Curie point of the said magnetic means, this value thus defining the predetermined temperature threshold.

7. A ventilated enclosure according to claim 6, wherein the Curie point of the magnetic means is 70° C., and the electrical resistor associated with said magnetic means is selected so as to dissipate a power of the order of 1.5 watts in the form of heat energy.

8. A ventilated enclosure according to claim 6 wherein each casing is made from a thermally insulating material.

9. A ventilated enclosure according to claim 2 wherein each detection device also includes a heating element mounted close to the detection element of the device for raising the detection element to the said predetermined temperature threshold when the limiting temperature not be exceeded in the enclosure is lower than the predetermined temperature threshold, and when the air output of the associated fan is equal to the predetermined limiting value.

10. A ventilated enclosure according to claim 2 wherein the number and size of the orifices in each casing cause the thermal detection element contained in the casing to be brought to the predetermined temperature threshold when the output of air from the fan which is associated with said casing falls to 60% of its normal value.

11. A ventilated enclosure according to claim 9 wherein the heating element comprises an electrical resistor having a value which is a function of the intensity of the current which it carries, such that the power dissipated by the resistor enables the associated thermal detection element to be raised to the predetermined temperature threshold in a time of not more than two minutes from the moment when the air output of the associated fan falls to 60% of its normal value.

12. A ventilated enclosure according to claim 11 wherein the thermal detection element includes permanent magnetic means and a two position electrical switch, said switch having resilient contacts biased toward a first position but being normally held in a second position by the forces exerted by the said magnetic means, said magnetic means being temperature sensitive such that the contacts return to their first position when the temperature of the casing within which the thermal detection element is situated reaches a value corresponding to the Curie point of the said magnetic means, this value thus defining the predetermined temperature threshold.

13. A ventilated enclosure according to claim 12 wherein the Curie point of the magnetic means is 70° C., and the electrical resistor associated with these means is selected so as to dissipate a power of the order of 1.5 watts in the form of heat energy.

14. A ventilated enclosure according to claim 13 wherein each casing is made from a thermally insulating material.

* * * * *